(12) United States Patent
Gu (10) Patent No.: US 10,396,104 B2
(45) Date of Patent: Aug. 27, 2019

(54) DISPLAY SUBSTRATE COMPRISING VERTICAL STORAGE CAPACITOR WITH INCREASED STORAGE CAPACITANCE, METHOD FOR FABRICATING THE SAME, AND DISPLAY DEVICE

(71) Applicant: BOE TECHNOLOGY GROUP CO., LTD., Beijing (CN)

(72) Inventor: Pengfei Gu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/866,675

(22) Filed: Jan. 10, 2018

(65) Prior Publication Data

US 2018/0331129 A1 Nov. 15, 2018

(30) Foreign Application Priority Data

May 12, 2017 (CN) .......................... 2017 1 0335157

(51) Int. Cl.
| | | |
|---|---|---|
| *H01L 27/08* | (2006.01) | |
| *H01L 27/12* | (2006.01) | |
| *H01L 27/32* | (2006.01) | |
| *H01L 49/02* | (2006.01) | |

(Continued)

(52) U.S. Cl.
CPC ...... *H01L 27/1255* (2013.01); *H01L 27/0805* (2013.01); *H01L 27/10808* (2013.01); *H01L 27/10817* (2013.01); *H01L 27/10852* (2013.01); *H01L 27/3265* (2013.01); *H01L 28/60* (2013.01); *H01L 28/90* (2013.01); *G02F 1/136213* (2013.01); *H01L 27/3248* (2013.01)

(58) Field of Classification Search
CPC ......... H01L 27/10852; H01L 27/10817; H01L 27/0805; H01L 27/10808; H01L 27/1255; H01L 27/3265; H01L 28/90
See application file for complete search history.

(56) References Cited

U.S. PATENT DOCUMENTS 6,159,818 A * 12/2000 Durcan ............. H01L 27/10817
257/E21.019
6,395,600 B1 * 5/2002 Durcan ............. H01L 27/10888
257/E21.019

(Continued)

FOREIGN PATENT DOCUMENTS

| CN | 105529334 A | 4/2016 |
| CN | 106125436 A | 11/2016 |

OTHER PUBLICATIONS

First Office Action for Chinese Patent Application No. 201710335157.3 dated May 7, 2019.

*Primary Examiner* — Ngan V Ngo
(74) *Attorney, Agent, or Firm* — Calfee, Halter & Griswold LLP (57) ABSTRACT

A display substrate is disclosed. The display device includes a first electrode, a second electrode, and a vertical storage capacitor in an insulating layer. The vertical storage capacitor includes a first plate and a second plate which are spaced apart. The first plate is connected with the first electrode, the second plate is connected with the second electrode, and the first plate and the second plate are perpendicular with or tilted with respect to the substrate. A method for fabricating the display substrate and a display device are also disclosed.

19 Claims, 3 Drawing Sheets

(51) Int. Cl.
    *G02F 1/1362*     (2006.01)
    *H01L 27/108*     (2006.01)

(56) References Cited

U.S. PATENT DOCUMENTS

| | | | | |
|---|---|---|---|---|
| 6,476,432 | B1* | 11/2002 | Basceri | H01L 27/10808 257/296 |
| 6,617,206 | B1* | 9/2003 | Sandhu | H01L 21/31654 257/E21.01 |
| 7,114,397 | B2* | 10/2006 | Fortin | G01L 1/148 73/756 |
| 7,977,257 | B2* | 7/2011 | Kim | H01L 28/75 257/303 |
| 8,389,373 | B2* | 3/2013 | Doebler | H01L 21/76816 257/306 |
| 9,666,262 | B2* | 5/2017 | Kim | G11C 5/14 |
| 9,911,689 | B2* | 3/2018 | Lee | H01L 21/76898 |
| 2005/0199069 | A1* | 9/2005 | Fortin | G01L 1/148 73/718 |
| 2008/0218937 | A1* | 9/2008 | Kehoe | H01G 2/065 361/328 |
| 2013/0242643 | A1* | 9/2013 | Kim | G11C 5/14 365/149 |
| 2013/0249053 | A1* | 9/2013 | Lee | H01L 28/40 257/532 |
| 2016/0111483 | A1 | 4/2016 | Park et al. | |
| 2016/0149156 | A1* | 5/2016 | Kim | H01L 51/5228 257/40 |
| 2016/0204110 | A1* | 7/2016 | Baskaran | H01L 27/0629 257/301 |
| 2017/0141115 | A1* | 5/2017 | Bower | H01Q 23/00 |
| 2018/0366492 | A1 | 12/2018 | Zhou | |

* cited by examiner

DISPLAY SUBSTRATE COMPRISING VERTICAL STORAGE CAPACITOR WITH INCREASED STORAGE CAPACITANCE, METHOD FOR FABRICATING THE SAME, AND DISPLAY DEVICE

RELATED APPLICATIONS

The present application claims the benefit of Chinese Patent Application No. 201710335157.3, filed on May 12, 2017, the entire disclosure of which is incorporated herein by reference.

TECHNICAL FIELD

The present disclosure relates to the field of display technology, and particularly to a display substrate, a method for fabricating the same, and a display device.

BACKGROUND

In a display device such as a liquid crystal display device, a storage capacitor is configured to maintain a voltage of a pixel electrode in a certain range for a preset time, after a thin film transistor is turned off. The storage capacitor is required to have a sufficient capacitance to avoid problems like pixel flickering, low contrast, and cross-talk, and to improve the display quality. Increase in an area of the storage capacitor may increase the capacitance. Since the storage capacitor is generally formed of an opaque metal, when the area of the storage capacitor is increased, an aperture ratio of a pixel unit reduces and the display luminance reduces.

SUMMARY

In a first aspect, embodiments of the present disclosure provide a display substrate, comprising a substrate, a plurality of device layers which are formed on the substrate, and an insulating layer which is formed between the device layers. The display substrate further comprises a first electrode, a second electrode, and a vertical storage capacitor which is arranged in the insulating layer. The vertical storage capacitor comprises a first plate and a second plate which are spaced apart, the first plate is connected with the first electrode, and the second plate is connected with the second electrode. The first plate and the second plate are perpendicular with or tilted with respect to the substrate.

In the context of the present disclosure, the term "a vertical storage capacitor" refers to a storage capacitor which extends substantially in a vertical direction, and does not indicate that the storage capacitor is perpendicular with a plane in which the substrate of display substrate lies.

In an embodiment, the first plate and second plate intersect with a normal of the substrate by an angle not more than 10 degrees.

In an embodiment, the insulating layer is an interlayer dielectric layer which is arranged between two device layers out of the plurality of device layers.

In an embodiment, the insulating layer is a planarization layer which is arranged between the plurality of device layers.

In an embodiment, the display substrate comprises a plurality of pixel units, each of the pixel units comprises a display region and a peripheral region, and the vertical storage capacitor is arranged in the peripheral region.

In an embodiment, the display substrate further comprises the display substrate further comprises a horizontal storage capacitor which is arranged in the peripheral region of each of the pixel units, the horizontal storage capacitor comprises an upper plate and a lower plate which are spaced apart, and the upper plate and lower plate are parallel with the substrate.

In an embodiment, a projection of the vertical storage capacitor on the substrate falls within a projection of the horizontal storage capacitor on the substrate.

In an embodiment, a projection of the vertical storage capacitor on the substrate does not overlap with a projection of the horizontal storage capacitor on the substrate.

In an embodiment, the interlayer dielectric layer has a thickness of 300 nm-1500 nm.

In an embodiment, the planarization layer has a thickness of 1000-3000 nm.

In an embodiment, the first plate and the second plate are spaced apart by an interval of 100-300 nm.

In an embodiment, projections of the first plate and the second plate on the substrate have a folding line shape or spiral shape.

In an embodiment, the interlayer dielectric layer comprises silicon oxide, silicon nitride, silicon oxynitride, aluminum oxide, titanium oxide, tantalum oxide, hafnium oxide, or zirconium oxide.

In an embodiment, the planarization layer comprises polyimide, polyamide, acrylic resin, benzocyclobutene, or phenolic resin.

In an embodiment, the vertical storage capacitor further comprises an insulating spacer which is arranged between the first plate and the second plate, and the insulating spacer has a dielectric constant larger than that of the insulating layer.

In an embodiment, the display substrate further comprises a driver thin film transistor which is arranged on the substrate, the first plate is electrically gate which is connected with the driver thin film transistor, and the second electrode is a source or drain of the driver thin film transistor.

In an embodiment, the display device comprises a protection layer and a planarization layer which cover the driver thin film transistor, and an interlayer dielectric layer which insulates the gate from the source or drain of the driver thin film transistor, and the first plate and the second plate are arranged in the planarization layer; wherein the first plate is connected with the source through a second via hole which penetrates the protection layer, and the second plate is connected with a gate connection part through a third via hole which penetrates the protection layer and a second via hole which penetrates the interlayer dielectric layer; and wherein the gate connection part is arranged in a same layer as the gate of the driver thin film transistor, and is connected with the gate.

In an embodiment, the display device comprises a planarization layer which covers the driver thin film transistor, and the first plate and the second plate are arranged in the planarization layer; wherein the first plate penetrates the planarization layer and is connected with the source, and the second plate penetrates the planarization layer and is connected with the gate connection part; and wherein the gate connection part is arranged in a same layer as the gate of the driver thin film transistor, and is connected with the gate.

In a second aspect, embodiments of the present disclosure provide a display device, comprising the display substrate as described above.

In a third aspect, embodiments of the present disclosure provide a method for fabricating a display substrate, comprising: forming device layers on a substrate;
forming an insulating layer on the device layers; and
forming a vertical storage capacitor in the insulating layer, wherein the vertical storage capacitor comprises a first plate and a second plate which are spaced apart, the first plate and the second plate are perpendicular with or tilted with respect to the substrate.

BRIEF DESCRIPTION OF THE DRAWINGS

In order to explain the technical solutions in the embodiments of the present disclosure more clearly, the drawings to be used in the description of the embodiments will be introduced briefly in the following. Apparently, the drawings described below are only some embodiments of the present disclosure, a person with ordinary skill in the art, on the premise of not paying any creative work, can also obtain other drawings from these drawings.

DETAILED DESCRIPTION OF EMBODIMENTS

The display substrate, the method for fabricating the same, the display panel, and the display apparatus in embodiments of the present disclosure will be described in detail hereinafter with reference to the accompanying drawing.

In a display device, a storage capacitor generally is a horizontal capacitor comprising plates parallel with a plane in which a display substrate lies. An increase in an area of the storage capacitor will lead to undesirable results. For example, it is unfavorable to reduce a size of pixels, and thus is unfavorable to improve a resolution of the display device. Therefore, there is need to increase the storage capacitance in the art.

Figure 1:
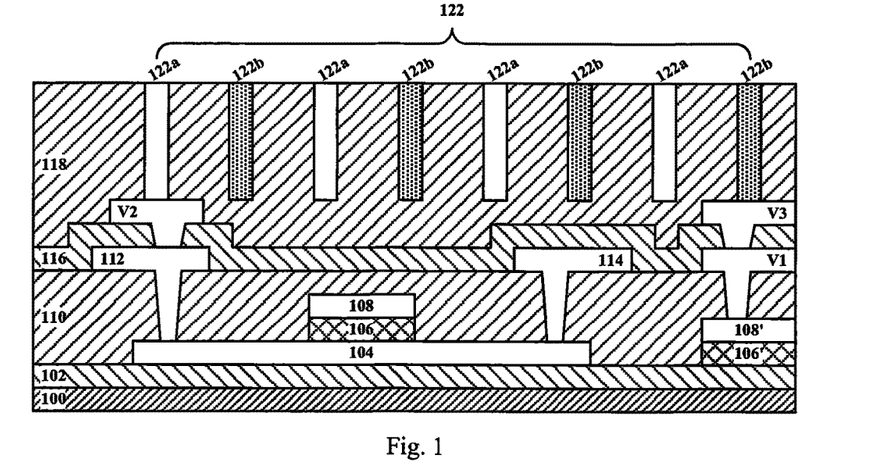
FIG. 1 is a cross-sectional view for illustrating a display substrate in an embodiment of the present disclosure.

A display substrate in an embodiment of the present disclosure will be described hereinafter with reference to FIG. 1. As shown in FIG. 1, in an embodiment, the display substrate comprises a substrate 100, a plurality of device layers which are formed on the substrate, and an insulating layer which is formed between the device layers.

In the embodiment shown in FIG. 1, the display substrate comprises a driver thin film transistor. The driver thin film transistor comprises an active layer 104, a gate 108, a source 112 and a drain 114 which are formed on the substrate 100. For example, a buffer layer 102 is further arranged between the substrate 100 and the active layer 104. The buffer layer 102 facilitates preventing impurities in the substrate 100 from entering the active layer 104, which would otherwise affect electrical performance of the driver thin film transistor. A gate insulating layer 106 is arranged between the active layer 104 and the gate 108. The source 112 and the drain 114 are spaced apart from the gate 108 by an interlayer dielectric layer 110. A protection layer 116 covers the driver thin film transistor, and a planarization layer 118 covers the protection layer 116 to provide a flat top surface.

As shown in FIG. 1, the display substrate further comprises a vertical storage capacitor 122 in the planarization layer 118. The vertical storage capacitor 122 comprises a first plate 122a and a second plate 122b which are spaced apart. The first plate 122a and the second plate 122b are perpendicular with the substrate 100, or are tilted with respect to the substrate 100. By forming the vertical storage capacitor 122 in the planarization layer 118 of the display substrate which is perpendicular with or tilted with respect to the substrate 100, the storage capacitance in the display substrate is effectively increased.

As shown in FIG. 1, the vertical storage capacitor 122 comprises the first plate 122a and the second plate 122b which are made from an electrically conductive material. The first plate 122a is electrically connected with the source 112 of the driver thin film transistor through a second via hole V2 which penetrates the protection layer 116. The second plate 122b is electrically connected with a gate connection part 108' through a third via hole V3 which penetrates the protection layer 116 and a first via hole V1 which penetrates the interlayer dielectric layer 110. Here, a stack of the gate insulating layer 106' and the gate connection part 108' and a stack of the gate insulating layer 106 and the gate 108 are formed by a same patterning process. In particular, the gate insulating layer 106 and the gate insulating layer 106' are formed by a same film-forming process, the gate 108 and the gate connection part 108' are formed by a same film-forming process, and then the stack of the gate insulating layer 106 and the gate 108 and the stack of the gate insulating layer 106' and the gate connection part 108' are formed simultaneously by a same patterning process.

A flow chart of a method for fabricating a display substrate in an embodiment of the present disclosure will be described hereinafter with reference to FIG. 2.

Figure 2:
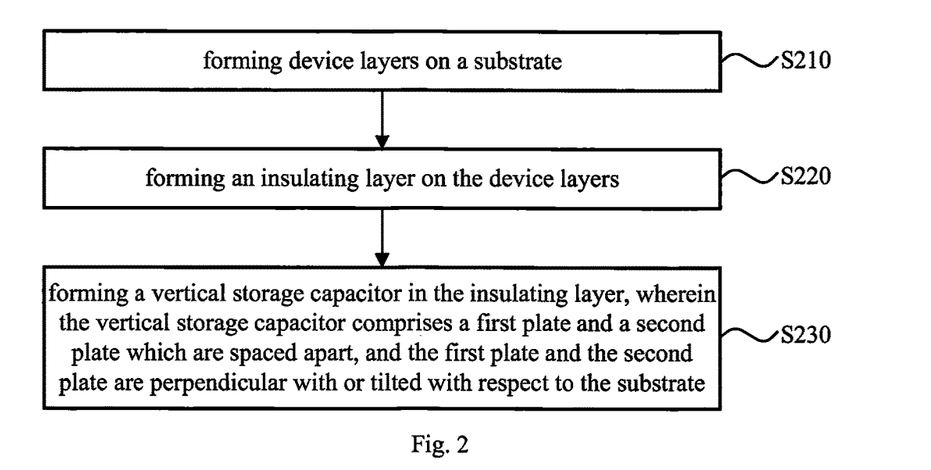
FIG. 2 is a flow chart for illustrating a method for fabricating a display substrate in an embodiment of the present disclosure.

As shown in FIG. 2, for example, a method for fabricating a display substrate comprises:

step S210, forming device layers on a substrate;

step S220, forming an insulating layer on the device layers; and step S230, forming a vertical storage capacitor in the insulating layer, wherein the vertical storage capacitor comprises a first plate and a second plate which are spaced apart, and the first plate and the second plate are perpendicular with or tilted with respect to the substrate.

A process for fabricating a display substrate in an embodiment of the present disclosure will be described hereinafter with reference to FIGS. 3A, 3B, 3C, 3D, 3E, 3F and 3G.

Figure 3A:
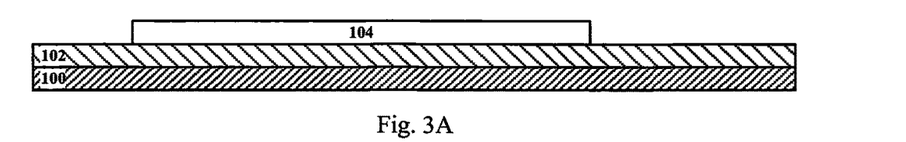
FIGS. 3A, 3B, 3C, 3D, 3E, 3F and 3G are cross-sectional views for illustrating a display substrate at various fabricating stages in an embodiment of the present disclosure.

As shown in FIG. 3A, a layer of material for active layer is formed on the substrate 100, and is subject to a patterning process to form a pattern comprising the active layer 104.

In an embodiment, prior to forming the pattern comprising the active layer 104, the step can further comprise forming the buffer layer 102 on the substrate 100. For example, the buffer layer 102 has a total thickness of 200-500 nm, and the buffer layer 102 is a dual-layer stack of silicon dioxide and silicon nitride.

Herein, the patterning process comprises procedures such as photoresist coating, exposing, development, etching, and photoresist lifting off. Since the procedures like photoresist coating are known by the person with ordinary skill in the art, these procedures will be described in detail in the patterning process in embodiments of the present disclosure. However, this does not indicate that these procedures are absent or omitted.

Figure 3B:
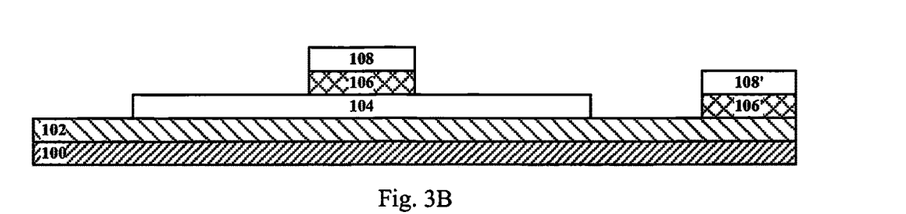

As shown in FIG. 3B, on the substrate 100 on which the pattern comprising the active layer 104 has been formed, the stack of the gate insulating layer 106 and the gate 108 are formed, and a patterning process is performed on the stack to form a pattern comprising the gate insulating layer 106 and the gate 108.

For example, the gate insulating layer 106 is deposited on the substrate 100 on which the pattern comprising the active layer 104 has been formed, by plasma enhanced chemical vapor deposition or the like. Then, a gate metal layer is formed on the gate insulating layer 106 by sputtering, evaporation or the like, and a patterning process is performed on the gate insulating layer and the gate metal layer to form the pattern comprising the gate insulating layer 106 and the gate 108. In addition, in this step, at a same time as forming the stack of the gate insulating layer 106 and the gate 108, the stack of the gate insulating layer 106' and the gate connection part 108' is formed. The substrate 100 on which the gate 108 has been formed is subject to a plasma treatment, so as to convert an exposed portion of the active layer 104 into a conductor. This facilitates improving the electrically conductivity of a channel of thin film transistor which will be formed subsequently.

Figure 3C:
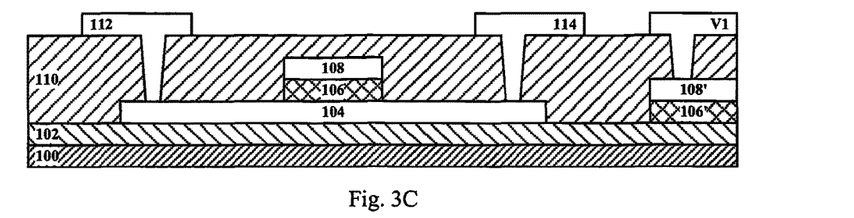

As shown in FIG. 3C, on the substrate 100 on which a pattern comprising the gate 108 has been formed, the interlayer dielectric layer 110 is formed, the source 112 and the drain 114 which are connected with the active layer 104 are formed, and the first via hole V1 which is connected with the gate connection part 108' is formed.

For example, the interlayer dielectric layer 110 is formed on the substrate 100 on which the pattern comprising the gate 108 has been formed, by plasma enhanced chemical vapor deposition or the like. A patterning process is performed on the interlayer dielectric layer 110 to form a contact hole which penetrates the interlayer dielectric layer 110, so that the active layer 104 and the gate connection part 108' are partially exposed. Then, a metal layer is formed by sputtering, evaporation or the like, and a pattern comprising the source 112, the drain 114 and the first via hole V1 is formed by a patterning process. The source 112 and the drain 114 are connected with the active layer 104 through the contact hole, and the first via hole V1 is connected with the gate connection part 108'. For example, the interlayer dielectric layer 110 has a thickness of 300 nm-1500 nm. For example, the interlayer dielectric layer 110 is made of silicon oxide, silicon nitride, silicon oxynitride, aluminum oxide, titanium oxide, tantalum oxide, hafnium oxide, or zirconium oxide form.

Figure 3D:
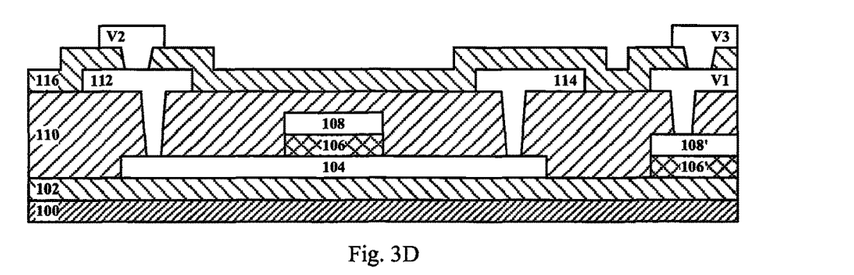

As shown in FIG. 3D, the protection layer 116 is formed on the substrate 100 on which has been formed thin film transistor, and a patterning process is performed to form the second via hole V2 and the third via hole V3 which penetrate the protection layer 116. The second via hole V2 is connected with the source 112, and the third via hole V3 is connected with the first via hole V1.

Figure 3E:
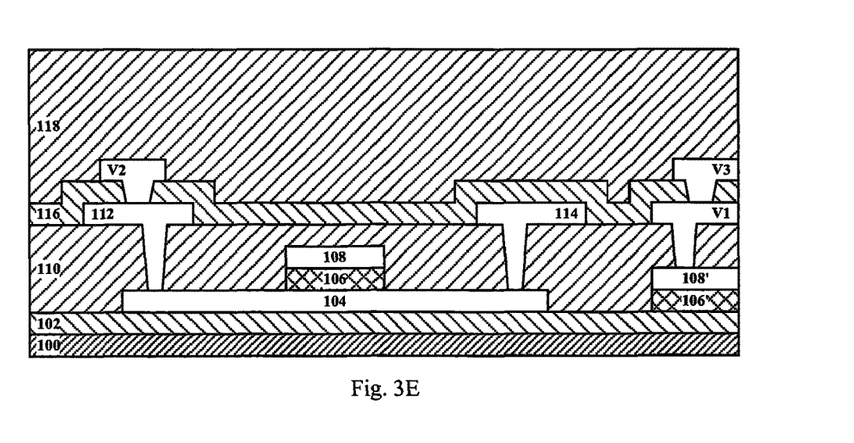

As shown in FIG. 3E, the planarization layer 118 is formed on the substrate 100 on which the second via hole V2 and the third via hole V3 have been formed. In an embodiment, the planarization layer 118 comprises organic resin, for example polyimide, polyamide, acrylic resin, benzocyclobutene, or phenolic resin form. These organic resin materials have a relatively large dielectric constant. Since the resin material will be sandwiched between the subsequently formed first plate and second plate, this facilitates increasing the storage capacitance of the vertical storage capacitor.

Figure 3F:
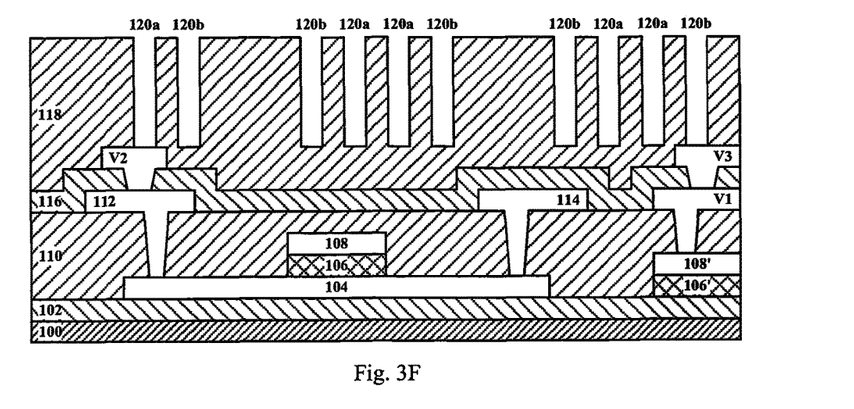

As shown in FIG. 3F, a first trench 120a and a second trench 120b are formed in the planarization layer 118 by exposure and development procedures. For example, the first trench 120a exposes a portion of the second via hole V2, and the second trench 120b exposes a portion of the third via hole V3. As shown, the first trench 120a and the second trench 120b are perpendicular with the substrate 100.

Figure 3G:
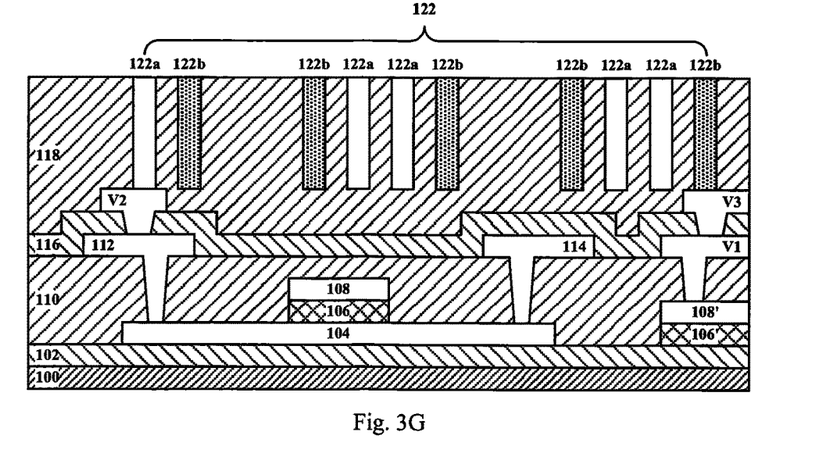

As shown in FIG. 3G, the first trench 120a and the second trench 120b are filled with an electrically conductive material by processes such as sputtering, evaporation, to form the first plate 122a and the second plate 122b. In an embodiment, the electrically conductive material for example is Cu, Al, Pt, Pd, Mo, Ag, Mg, Au, Ni, Ti, or the like. In other embodiments, the electrically conductive material is an electrically conductive oxide, for example ITO. As shown, the first plate 122a and the second plate 122b of the vertical storage capacitor 122 are perpendicular with the substrate 100. In other embodiments, the first plate 122a and the second plate 122b tilted with respect to the substrate. For example, the first plate 122a and the second plate 122b intersect with a normal of the substrate 100 by an angle not more than 10 degrees. The tilting arrangement of the first plate 122a and the second plate 122b facilitates increasing an effective area of the capacitor. This increases a storage capacitance of the vertical storage capacitor 122. The first plate 122a and the second plate 122b intersect with the normal of the substrate 100 by a small angle, e.g. less than 5 degrees. This facilitates forming the first trench 120a and the second trench 120b in the planarization layer 118 and then filling the trenches with an electrically conductive material to form the first plate 122a and the second plate 122b. It is noted that, for sake of simplicity, the accompanying drawings only show a case in which the first plate 122a and the second plate 122b are perpendicular with the substrate 100.

With the above steps, the process for fabricating the display substrate in embodiments of the present disclosure is complete.

In the embodiment as described in FIGS. 3D-3G, after forming the protection layer 116, the second via hole V2 which is connected with the source 112 and the third via hole V3 which is connected with the gate connection part 108' are formed in the protection layer 116. Then, the planarization layer 118 is formed, and the first plate 122a and the second plate 122b are formed in the planarization layer 118 which are connected with the second via hole V2 and the third via hole V3, respectively, so that the first plate 122a and the second plate 122b are connected with the source 112 and the gate 108 of the driver film transistor, respectively.

As described above, the protection layer 116 is optional. In an embodiment, the display substrate does not comprise the protection layer 116. In this case, the planarization layer 118 is formed on the substrate 100 of FIG. 3C, and the first trench 120a and the second trench 120b are then formed in the planarization layer 118, which expose the source 112 and the first via hole V1, respectively. Then, the first trench 120a and the second trench 120b are filled with an electrically conductive material, respectively, to form the first plate 122a and the second plate 122b. As compared with the embodiment of FIGS. 3D-3G, the second via hole V2 and the third via hole V3 are omitted in this embodiment, and the first plate 122a and the second plate 122b further have the function of these via holes. According to this embodiment, the layers or components (i.e., the protection layer, the second via hole, and the third via hole) in the display substrate can be decreased, and accordingly the process can be simplified.

Figure 4:
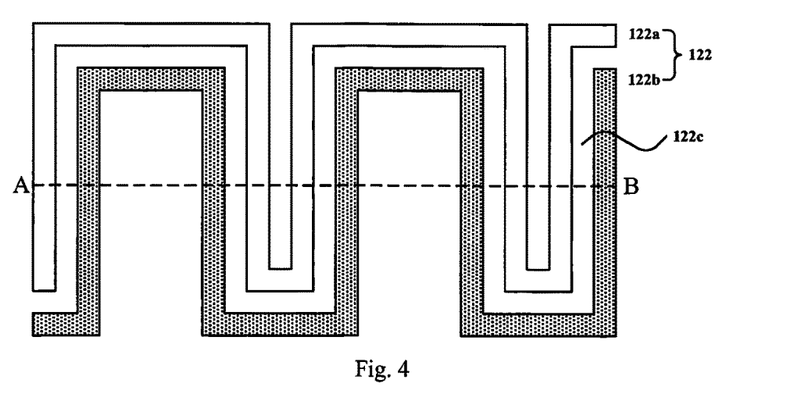
FIG. 4 is a top view for illustrating a vertical storage capacitor in an embodiment of the present disclosure.

FIG. 4 schematically shows a top view of the vertical storage capacitor of FIG. 3G. The cross-sectional view of FIG. 3G is along a dashed line AB of the display substrate. As shown in FIG. 4, the vertical storage capacitor 122 comprises the first plate 122a and the second plate 122b, and projections of the first plate 122a and the second plate 122b on the substrate 100 have a folding line shape. In other embodiments, projections of the first plate 122a and the second plate 122b on the substrate 100 have a spiral shape, which is similar with a spiral design in the conventional electrolytic capacitor. This facilitates increasing effective areas of the first plate and the second plate, and thus increasing the storage capacitance.

For example, the first plate 122a and the second plate 122b are spaced apart by an interval of 100-300 nm, for instance about 150 nm. The first plate 122a and the second plate 122b are arranged in such a manner that the interval is small, and the vertical storage capacitor 122 has an increased storage capacitance.

In an embodiment, the organic resin between the first plate 122a and the second plate 122b is removed, and then an insulating spacer 122c is filled. The insulating spacer 122c has a dielectric constant larger than that of the organic resin. This facilitates increasing the storage capacitance of the vertical storage capacitor 122.

In the above embodiment, the display substrate has been described with reference to a thin film transistor of a bottom-gate type in which the gate is arranged below the source and drain. However, in embodiments of the present disclosure, the thin film transistor is not restricted in term of structure. For example, the thin film transistor can be of a top-gate, in which the gate is arranged above the source and drain.

In the above embodiment, the display substrate has been described in which the vertical storage capacitor is arranged in the planarization layer. However, embodiments of the present disclosure do not intend to limit the layer in which the vertical storage capacitor is arranged. The vertical storage capacitor can be arranged in any insulating layer of the display substrate. For example, in an embodiment, the vertical storage capacitor is arranged in the interlayer dielectric layer 110 of the display substrate. In this embodiment, the interlayer dielectric layer 110 has a thickness of 300 nm-1500 nm. According to this embodiment, when the first plate and the second plate are perpendicular with the substrate, the first plate and the second plate have a dimension of 300 nm-1500 nm in a vertical direction. In an embodiment, the interlayer dielectric layer 110 is formed by silicon oxide, silicon nitride, silicon oxynitride, aluminum oxide, titanium oxide, tantalum oxide, hafnium oxide, or zirconium oxide. These oxide insulating materials have a relatively large dielectric constant, i.e., the material between first plate and the second plate has a relatively large dielectric constant. This facilitates increasing the storage capacitance of vertical storage capacitor.

The arrangement of the vertical storage capacitor according to embodiments of the present disclosure in the display substrate will be described.

The display substrate generally comprises a plurality of pixel units. Each of the pixel units comprises a display region and a peripheral region. In an embodiment, the vertical storage capacitor as described above is arranged in the peripheral region. Since the peripheral region of the pixel unit is generally opaque, the vertical storage capacitor in the peripheral region will not affect the aperture ratio of the display substrate.

In an embodiment, the display substrate further comprises a horizontal storage capacitor in the peripheral region of each of the pixel units. The horizontal storage capacitor comprises an upper plate and a lower plate which are spaced apart. The upper plate and the lower plate are parallel with the substrate. According to this embodiment, the display substrate comprises both the horizontal storage capacitor and the vertical storage capacitor. The vertical storage capacitor provides additional capacitance, which supplements that of the common horizontal storage capacitor. This facilitates increasing the storage capacitance in the display substrate. In an embodiment, a projection of the vertical storage capacitor on the substrate falls within a projection of the horizontal storage capacitor on the substrate. According to this embodiment, since the horizontal storage capacitor generally is opaque, and the vertical storage capacitor is arranged in an opaque region of the display substrate in which the horizontal storage capacitor is located, the vertical storage capacitor will not affect the aperture ratio of the di splay substrate.

In an embodiment, a projection of the vertical storage capacitor on the substrate does not overlap with a projection of the horizontal storage capacitor on the substrate. According to this embodiment, the projection of the vertical storage capacitor does not overlap that of the horizontal storage capacitor. Due to the presence of the vertical storage capacitor, the area of the horizontal storage capacitor can be decreased to increase the aperture ratio of the display substrate. When the vertical storage capacitor has a sufficient storage capacitance, the horizontal storage capacitor can even be omitted. This facilitates further increasing the aperture ratio of the display substrate.

Figure 5:
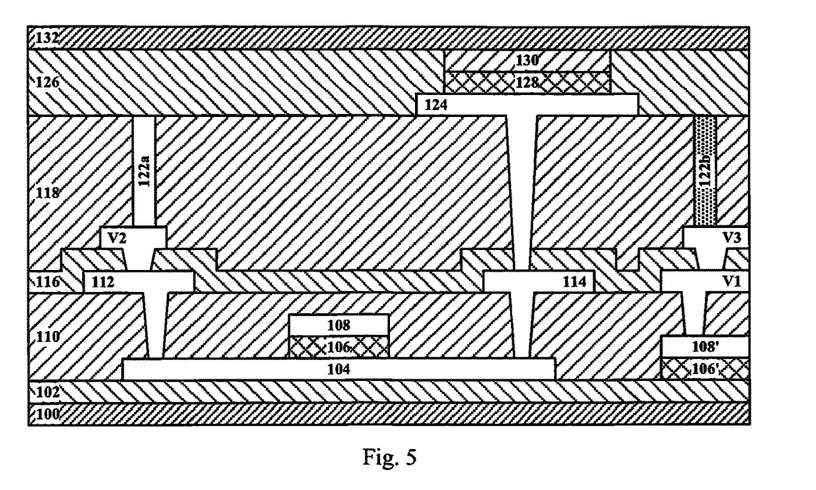
FIG. 5 is a cross-sectional view for illustrating a display device in an embodiment of the present disclosure.

A display device in an embodiment of the present disclosure will be described hereinafter with reference to FIG. 5. As shown in FIG. 5, a contact hole is formed in the display substrate of FIG. 3G. The contact hole penetrates the planarization layer 118, so that the drain 114 is partially exposed. Then, a metal layer is formed by sputtering, evaporation or the like, and a first electrode 124 is formed by a patterning process. The first electrode 124 is connected with the drain 114 through the contact hole. A pixel defining layer 126 is formed on the planarization layer 118 on which the first electrode 124 has been formed, and a patterning process is performed to expose a majority of the surface region of the first electrode 124. Then, a functional layer 128 and a second electrode 130 are formed in this order on the display substrate on which the pixel defining layer 126 has been formed. In an embodiment, the functional layer 128 comprises a hole injection layer, a hole transporting layer, a light emitting layer, an electron transporting layer and/or an electron injection layer. The first electrode 124, the functional layer 128 and the second electrode 130 thus form an organic light-emitting element. The organic light-emitting element is encapsulated with an encapsulation substrate 132, and a display device is obtained.

In the above embodiment, the display device has been described with reference to an organic light-emitting device (OLED). However, the display device according to embodiments of the present disclosure is not limited to this. In other embodiments, the display device can be a thin film transistor liquid crystal display device (TFT LCD). In this case, the process for fabricating the display device comprises steps of dropping liquid crystal onto the display substrate shown in FIG. 3G, assembling with a counter substrate such as a color film substrate, or the like. These steps are well known for the person with ordinary skill in the art, and are not repeated here for simplicity.

The display device in embodiments of the present disclosure can be any product or component with a display function, for example, a liquid crystal panel, an electron paper, a mobile phone, a tablet computer, a TV set, a monitor, a notebook computer, a digital photo frame, a navigator.

Embodiments of the present disclosure provide a display substrate, a method for fabricating the same, and a display device. The display device comprises a substrate, a plurality of device layers which are formed on the substrate, and an insulating layer which is formed between the device layers. The display substrate further comprises a first electrode, a second electrode, and a vertical storage capacitor which is arranged in the insulating layer. The vertical storage capacitor comprises a first plate and a second plate which are spaced apart, the first plate is connected with the first electrode, and the second plate is connected with the second electrode. The first plate and the second plate are perpendicular with or tilted with respect to the substrate. According to embodiments of the present disclosure, the vertical storage capacitor which is perpendicular with or tilted with respect to the substrate is formed in the insulating layer of the display substrate, so that the storage capacitance in the display substrate is effectively increased. The vertical storage capacitor is located in the existing insulating layer of the display substrate, and does not add any layer structure in the display substrate.

Apparently, the person with ordinary skill in the art can make various modifications and variations to the present disclosure without departing from the spirit and the scope of the present disclosure. In this way, provided that these modifications and variations of the present disclosure belong to the scopes of the claims of the present disclosure and the equivalent technologies thereof, the present disclosure also intends to encompass these modifications and variations.

What is claimed is:

1. A display substrate, comprising a substrate, a plurality of device layers which are formed on the substrate, and an insulating layer which is formed between the device layers, wherein the display substrate further comprises a first electrode, a second electrode, and a vertical storage capacitor which is arranged in the insulating layer;
the vertical storage capacitor comprises a first plate and a second plate which are spaced apart, the first plate is connected with the first electrode, and the second plate is connected with the second electrode; and
the first plate and the second plate are perpendicular with or tilted with respect to the substrate,
wherein the display substrate comprises a plurality of pixel units, each of the pixel units comprises a display region and a peripheral region, and the vertical storage capacitor is arranged in the peripheral region.

2. The display substrate of claim 1, wherein the first plate and second plate intersect with a normal of the substrate by an angle not more than 10 degrees.

3. The display substrate of claim 1, wherein the insulating layer is an interlayer dielectric layer which is arranged between two device layers out of the plurality of device layers.

4. The display substrate of claim 1, wherein the insulating layer is a planarization layer which is arranged between the plurality of device layers.

5. The display substrate of claim 1, wherein the display substrate further comprises a horizontal storage capacitor which is arranged in the peripheral region of each of the pixel units, the horizontal storage capacitor comprises an upper plate and a lower plate which are spaced apart, and the upper plate and lower plate are parallel with the substrate.

6. The display substrate of claim 5, wherein a projection of the vertical storage capacitor on the substrate falls within a projection of the horizontal storage capacitor on the substrate.

7. The display substrate of claim 5, wherein a projection of the vertical storage capacitor on the substrate does not overlap with a projection of the horizontal storage capacitor on the substrate.

8. The display substrate of claim 3, wherein the interlayer dielectric layer has a thickness of 300 nm-1500 nm.

9. The display substrate of claim 4, wherein the planarization layer has a thickness of 1000-3000 nm.

10. The display substrate of claim 1, wherein the first plate and the second plate are spaced apart by an interval of 100-300 nm.

11. The display substrate of claim 1, wherein projections of the first plate and the second plate on the substrate have a folding line shape or spiral shape.

12. The display substrate of claim 3, wherein the interlayer dielectric layer comprises silicon oxide, silicon nitride, silicon oxynitride, aluminum oxide, titanium oxide, tantalum oxide, hafnium oxide, or zirconium oxide.

13. The display substrate of claim 4, wherein the planarization layer comprises polyimide, polyamide, acrylic resin, benzocyclobutene, or phenolic resin.

14. The display substrate of claim 1, wherein the vertical storage capacitor further comprises an insulating spacer which is arranged between the first plate and the second plate, and the insulating spacer has a dielectric constant larger than that of the insulating layer.

15. The display substrate of claim 1, wherein the display substrate further comprises a driver thin film transistor which is arranged on the substrate, the first electrode is a gate of the driver thin film transistor, and the second electrode is a source or drain of the driver thin film transistor.

16. The display substrate of claim 15, wherein the display device comprises a protection layer and a planarization layer which cover the driver thin film transistor, and an interlayer dielectric layer which insulates the gate from the source or drain of the driver thin film transistor, and the first plate and the second plate are arranged in the planarization layer;
wherein the first plate is connected with the source through a second via hole which penetrates the protection layer, and the second plate is connected with a gate connection part through a third via hole which penetrates the protection layer and a second via hole which penetrates the interlayer dielectric layer; and
wherein the gate connection part is arranged in a same layer as the gate of the driver thin film transistor, and is connected with the gate.

17. The display substrate of claim 15, wherein the display device comprises a planarization layer which covers the driver thin film transistor, and the first plate and the second plate are arranged in the planarization layer;
wherein the first plate penetrates the planarization layer and is connected with the source, and the second plate penetrates the planarization layer and is connected with the gate connection part; and
wherein the gate connection part is arranged in a same layer as the gate of the driver thin film transistor, and is connected with the gate.

18. A display device, comprising the display substrate of claim 1.

19. A method for fabricating a display substrate, comprising:
forming device layers on a substrate;
forming an insulating layer on the device layers; and
forming a vertical storage capacitor in the insulating layer, wherein the vertical storage capacitor comprises a first plate and a second plate which are spaced apart, the first plate and the second plate are perpendicular with or tilted with respect to the substrate, wherein the display substrate comprises a plurality of pixel units, each of the pixel units comprises a display region and a peripheral region, and the vertical storage capacitor is arranged in the peripheral region.

* * * * *